United States Patent [19]
Renous

[11] Patent Number: 5,777,463
[45] Date of Patent: Jul. 7, 1998

[54] DEVICE FOR AUTO-ADAPTING TO THE IMPEDANCE OF A SUPPLY LINE

[75] Inventor: Claude Renous, Grenoble, France

[73] Assignee: SGS-Thomson Microelectronics S.A., Saint Genis, France

[21] Appl. No.: 773,146

[22] Filed: Dec. 26, 1996

[30] Foreign Application Priority Data

Dec. 27, 1995 [FR] France ..................... 95 15830

[51] Int. Cl.$^6$ ..................................................... G05F 1/40
[52] U.S. Cl. .......................... 323/293; 379/394; 379/398
[58] Field of Search ............................. 323/282, 286, 323/284, 268, 293; 379/394, 398, 310.05

[56] References Cited

U.S. PATENT DOCUMENTS

| 4,631,491 | 12/1986 | Smithers | 330/149 |
|---|---|---|---|
| 4,794,507 | 12/1988 | Cavigelli | 363/86 |
| 5,003,454 | 3/1991 | Bruning | 363/81 |
| 5,160,896 | 11/1992 | McCorkle | 330/251 |
| 5,477,185 | 12/1995 | Jouen | 327/579 |
| 5,541,543 | 7/1996 | Arnaud | 327/175 |

FOREIGN PATENT DOCUMENTS 37 44 112   6/1989   Germany ..................... H03F 1/02

*Primary Examiner*—Peter S. Wong
*Assistant Examiner*—Shawn Riley
*Attorney, Agent, or Firm*—Wolf, Greenfield & Sacks, P.C.

[57] ABSTRACT

A device for automatically adapting to the impedance of a supply line to optimally supply a load. The device includes a switched mode voltage regulator from which is drawn a signal to be provided to the load, a regulation loop to adjust the amplitude of the signal to be provided to the load as a function of the line voltage, and means for aligning the output voltage of the voltage regulator with the amplitude of the signal provided to the load.

43 Claims, 2 Drawing Sheets

5,777,463

DEVICE FOR AUTO-ADAPTING TO THE IMPEDANCE OF A SUPPLY LINE

BACKGROUND OF THE INVENTION

1. Field of the Invention

The present invention relates to a device whose impedance is automatically adapted to the impedance of a supply line in order to provide maximum power. More particularly, the present invention relates to the power supply of a loud-speaker of a telephone set during ringing to provide the loudest possible signal.

2. Discussion of the Related Art

FIG. 1 schematically represents a conventional ringing circuit allowing automatic adaptation to the impedance of a telephone line L. The circuit includes a rectifying bridge 10 providing a rectified line voltage $V_L$ to a regulator 12. Regulator 12 provides a constant regulated voltage Vcc which supplies a microprocessor 14 and a ring amplifier 16 that is connected to the loud-speaker 18. During a ringing, the microprocessor 14 provides a tune M, as a rectangular signal having a variable frequency, to be transmitted to the loud-speaker 18.

A telephone line has a non-negligible impedance $Z_L$ which varies in an indeterminate way from one telephone set to another. The power drawn from line L is maximum when the global impedance Z of the circuit(s) connected to the line is equal to impedance $Z_L$.

The circuit of FIG. 1 includes a regulation loop formed by a multiplier 20 which applies the product of signal M and the line voltage $V_L$ to the input of amplifier 16. The gain of amplifier 16 or of multiplier 20 is selected so that the amplitude of signal $V_A$ applied to the loud-speaker 18 stabilizes to a value for which the impedance Z of the circuit is close to the impedance $Z_L$ of line L. Thus, the amplitude of signal $V_A$ at the output of amplifier 16 is usually smaller than the amplifier's supply voltage Vcc. This causes a loss of power which is dissipated in amplifier 16 and is not provided to the loud-speaker 18.

European patent application 0,554,192 describes a similar ringing circuit which eliminates the loss of power in the amplifier, thereby providing more power to the loud-speaker. For this purpose, multiplier 20 is replaced with a pulse-width modulator which adjusts the duty cycle of the ringing signal as a function of the line voltage. However, when the available power is particularly low, for example when a plurality of telephone sets are connected in parallel to the same line, the signal transmitted to the loud-speaker is formed by narrow pulses which generate many unpleasant harmonics.

SUMMARY OF THE INVENTION

An object of the present invention is to provide a ringing circuit which is pleasant to hear, adapts to the line impedance, and optimally supplies a loud-speaker. A more general object of the present invention is to provide a device that adapts to the impedance of a power supply line and that optimally supplies a load by any signal drawn from the line.

To achieve these objects, the present invention provides a device for adapting to the impedance of a supply line to optimally supply a load, including a switched mode voltage regulator from which is drawn a signal provided to the load, a regulation loop to adjust the amplitude of the signal provided to the load as a function of the line voltage, and means for aligning the output voltage of the voltage regulator with the amplitude of the signal provided to the load.

According to an embodiment of the present invention, the alignment means includes comparison means for providing a detection signal which is active when the output voltage of the voltage regulator is lower than an adjusted amplitude of the signal to be provided to the load, and a low-pass filter for receiving the detection signal and modifying a reference voltage of the voltage regulator.

According to an embodiment of the present invention, the voltage regulator receives a low reference voltage to which the output voltage of the low-pass filter is added.

According to an embodiment of the present invention, the device includes an amplifier for supplying the load and receiving the product of an input signal multiplied by the line voltage, the comparison means being formed by a detector for detecting the saturation of the amplifier.

According to an embodiment of the present invention, the amplifier includes an output transistor supplying the load from the output voltage of the voltage regulator, the saturation detector being designed to detect the saturation of the output transistor.

BRIEF DESCRIPTION OF THE DRAWINGS

The foregoing and other objects, features, aspects and advantages of the present invention will be described by way of example with reference to the accompanying drawings, in which.

DETAILED DESCRIPTION

Figure 1:
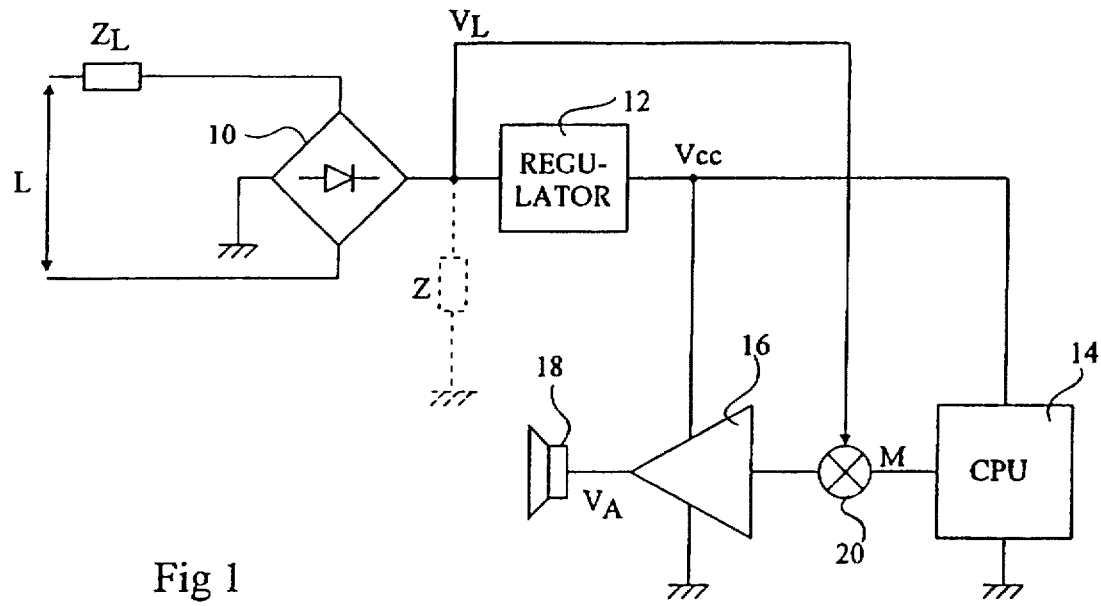
FIG. 1, described above, illustrates a conventional ringing circuit and the problem to be solved by the present invention.
Figure 2:
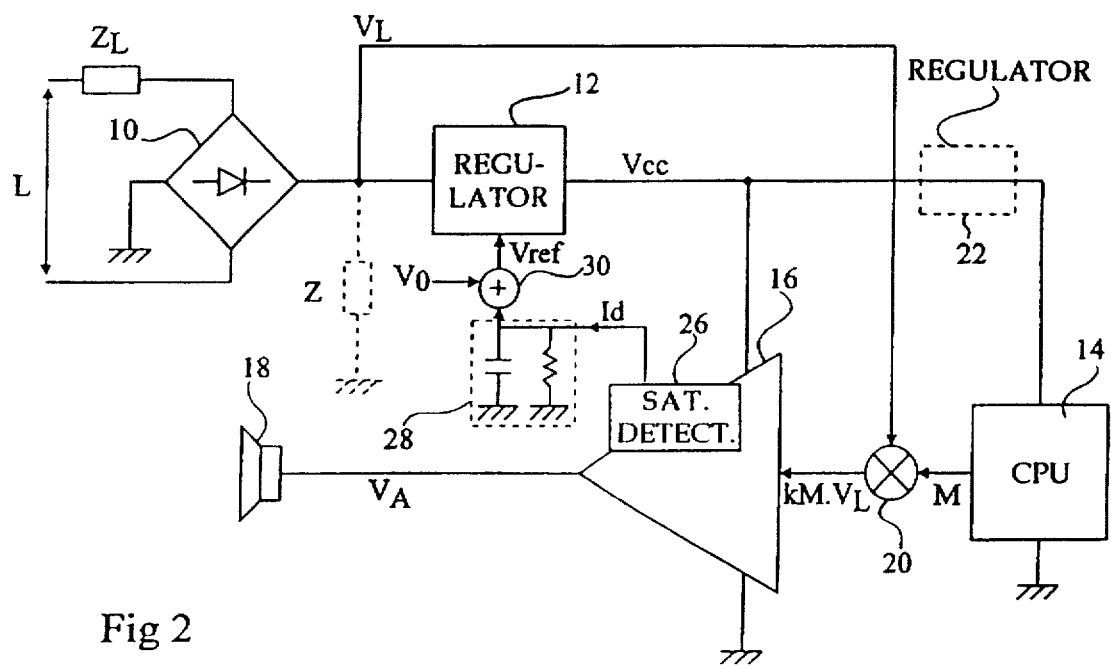
FIG. 2 shows an embodiment of a ringing circuit according to an embodiment of the present invention for adapting the ringing circuit impedance to the impedance of a supply line.

In FIG. 2, the same elements as in FIG. 1 are designated with the same reference characters. As in FIG. 1, a ringing circuit according to the present invention acts on the amplitude of signal $V_A$ provided by amplifier 16 to adjust the impedance Z of the circuit to the impedance $Z_L$ of the telephone line L.

According to an aspect of the present invention, in order to decrease the loss of power in amplifier 16, the output voltage Vcc of regulator 12 is aligned with the amplitude of signal $V_A$. Of course, to be able to modify the output voltage Vcc of regulator 12 without loss of power, regulator 12 should be a switched mode regulator, which is generally the case.

The variation range of voltage Vcc should be such that microprocessor 14 and amplifier 16 can suitably operate. Thus, voltage Vcc has a lower limit (frequently 3 volts) beneath which amplifier 16 and microprocessor 14 do not operate, and an upper limit at which microprocessor 14 consumes excessive current. It is advantageous to connect between regulator 12 and microprocessor 14 an additional regulator 22 which supplies microprocessor 14 with a constant voltage equal to the lower limit (3 volts) of voltage Vcc. Regulator 22 does not need to have a high performance and may be of simple structure (series regulator).

To align the output voltage Vcc of regulator 12 with the amplitude of voltage $V_A$ provided to the loud-speaker 18, the difference between voltage Vcc and the amplitude of voltage $V_A$ is detected and a reference voltage Vref of regulator 12 is modified as a function of the difference in order to reduce the difference.

FIG. 2 shows an embodiment to obtain this function. Amplifier 16 has a saturation detector 26 which provides a signal Id that is active when amplifier 16 starts to saturate, i.e., when the supply voltage Vcc is too low for amplifier 16 to provide a signal $V_A$ having an amplitude corresponding to its input signal $kM.V_L$ (coefficient k is the gain of multiplier 20 or a multiplying coefficient applied to either one of signals M and $V_L$). The detection signal Id is subjected to a low-pass filtering at 28 before being added at 30 to a low reference voltage $V_O$ to constitute the reference voltage Vref of regulator 12. The low reference voltage $V_O$ generally corresponds to the lower limit of voltage Vcc. Signal Id is generally a current; then, the low-pass filter 28 includes a capacitor and a resistor that are connected in parallel to a fixed voltage, for example to ground.

Figure 3A:
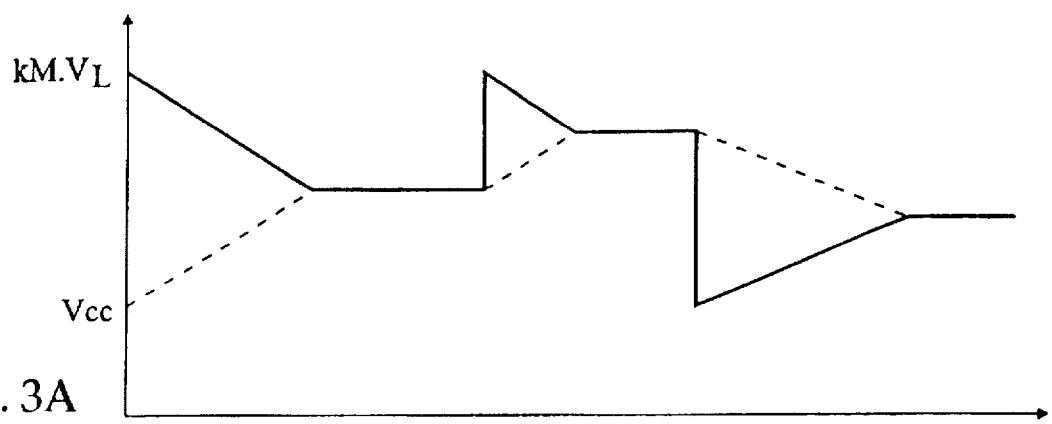
FIG. 3 schematically shows waveforms of signals to illustrate the operation of the circuit of FIG. 2.
Figure 3B:
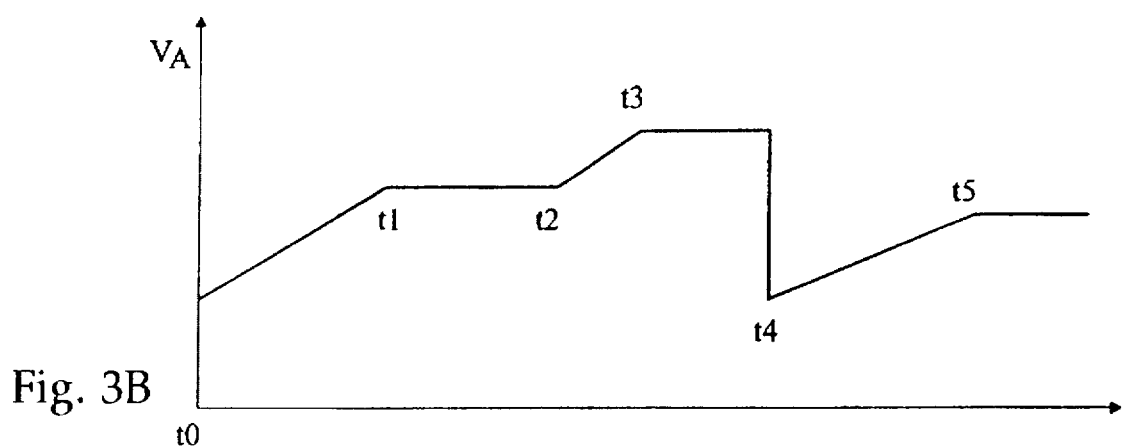

FIG. 3 illustrates an exemplary variation of the input voltage $kM.V_L$ of amplifier 16, of the output voltage Vcc of regulator 12, and of voltage $V_A$ provided to the loud-speaker 18. It is assumed that amplifier 16 has a unity gain, and therefore that the amplitude of signal $V_A$ is normally equal to the amplitude of signal $kM.V_L$. Although signal M is normally rectangular in a ringing circuit, it is assumed in this case that the signal is a d.c. signal and is equal to 1, which simplifies the understanding and shows that the device according to the invention may be used to optimally supply a load (18) with an arbitrary signal.

Initially, at time t0, voltage Vcc is at its lower limit, which is determined by the low reference voltage $V_O$. Signal M goes from a zero value to its (constant) nominal value. The impedance Z of the circuit is initially high, since the circuit practically does not consume any current until time t0. Thus, the line voltage $V_L$, and therefore product $kM.V_L$, are so high that amplifier 16 saturates (the amplitude of signal $V_A$ is equal to voltage Vcc). The saturation detector 26 provides a current Id which charges the capacitor of filter 28, thereby causing the reference voltage Vref, and thus voltage Vcc, to increase. Voltage $V_A$ follows this variation because product $kM.V_L$ is still too high. As a consequence, the impedance Z of the circuit decreases since amplifier 16 provides an increasing current to the loud-speaker 18. Thus, voltage $V_L$ starts to decrease until it reaches, at time t1, a value where the amplitude of voltage $V_A$ is equal to product $kM.V_L$.

At time t1, an equilibrium state is reached where amplifier 16 is at its saturation limit and where the saturation detector 26 provides a current Id that is just sufficient to maintain the voltage constant across the capacitor of filter 28, and thus to maintain voltage Vcc constant.

The equilibrium state at time t1 should correspond to the optimal adjustment. For this purpose, coefficient k is selected so that the line voltage $V_L$ is, at the equilibrium state, equal to half the nominal voltage upstream from line L (i.e., the impedance Z of the circuit is equal to the line impedance $Z_L$). The optimal coefficient k is expressed by:

$$k = \sqrt{\frac{\rho \cdot R_{HP}}{Z_L}} \quad (1)$$

where $R_{HP}$ is the resistance of the loud-speaker 18 and ρ the global efficiency of regulator 12 and of amplifier 16.

At time t2, the available power on line L abruptly increases, for example further to the disconnection of a telephone set. This power increase causes an increase of the line voltage $V_L$, and therefore of product $kM.V_L$. Since voltage Vcc does not immediately follow this variation, amplifier 16 can no longer provide a signal $V_A$ having an amplitude corresponding to product $kM.V_L$. Amplifier 16 saturates and voltage Vcc increases while voltage $V_L$ decreases.

At time t3, amplifier 16 is again at its saturation limit. Voltage Vcc then stabilizes at a value higher than the value reached at time t1, since a higher power is available.

At time t4, the available power abruptly drops, for example because one or more telephone sets are connected to the line. Voltage $V_L$ drops to such an extent that product $kM.V_L$ becomes lower than voltage Vcc. Therefore, amplifier 16 provides the corresponding signal $V_A$ without saturating. The saturation detector 26 remains inactive, the capacitor of filter 28 discharges, and voltage Vcc decreases. Voltage Vcc then approaches the amplitude of signal $V_A$, which reduces the loss of power in amplifier 16. Since the loss of power in amplifier 16 decreases, the impedance Z of the circuit, and therefore the line voltage $V_L$, increase. As a consequence, product $kM.V_L$ and the amplitude of signal $V_A$ increase.

At time t5, the amplitude of signal $V_A$ and voltage Vcc are such that amplifier 16 is at its saturation limit, which again corresponds to an optimal equilibrium state.

Although the above description is based on the example of a d.c. signal M, it is clear that signal M can be an arbitrary signal, and more particularly an a.c. signal (of rectangular or any other shape), to generate a tune. The variations represented in FIG. 3 for d.c. signals would then be the envelopes of the corresponding a.c. signals.

The above equation (1) provides the optimal coefficient k for a d.c. signal M. For an arbitrary signal M, the value given by the equation is multiplied by the ratio between the peak value of signal M and its mean value. In addition, the optimal coefficient k depends on the predetermined line impedance. Generally, the line impedance varies from one location to another and from one country to another. Thus, one may use the mean line impedance to calculate coefficient k.

Figure 4:
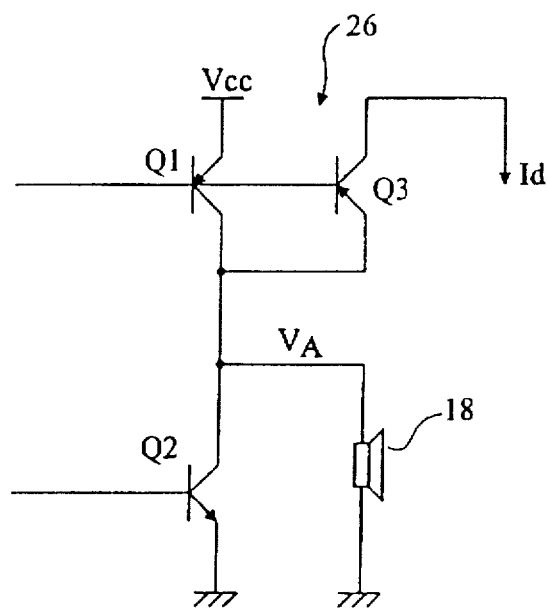
FIG. 4 shows an exemplary saturation detector that may be used in the circuit of FIG. 2.

FIG. 4 shows an exemplary saturation detector associated with a conventional output stage of an amplifier. The output stage includes a PNP transistor Q1 and an NPN transistor Q2 whose collectors provide voltage $V_A$ that is applied to the loud-speaker 18. The emitter of transistor Q1 receives the supply voltage Vcc and the emitter of transistor Q2 is grounded. The bases of transistors Q1 and Q2 are conventionally controlled so that only one of the two transistors is conductive at a time. The saturation detector 26 includes a PNP transistor Q3 whose emitter is connected to the collector of transistor Q1 and whose base is connected to the base of transistor Q1.

When transistor Q1 operates in linear mode, its base-emitter voltage is lower than or equal to its collector-emitter voltage. As a result, transistor Q3 is blocked since its base-emitter junction is reverse biased. In contrast, when transistor Q1 saturates, its collector-emitter voltage is significantly lower than its base-emitter voltage. The base-emitter junction of transistor Q3 is then forward biased and its collector provides the detection current Id.

Of course, if the loud-speaker 18 were connected to the supply voltage Vcc instead of ground, transistor Q2 would then be provided with an NPN saturation detection transistor that is symmetrical to transistor Q3.

The invention has been described for a telephone ringing circuit, but those skilled in the art will appreciate that the invention can apply to other impedance adapting circuits in which the highest possible power should be provided to a load.

Having thus described at least one illustrative embodiment of the invention, various alterations, modifications and improvements will readily occur to those skilled in the art. Such alterations, modifications, and improvements are intended to be within the spirit and scope of the invention. Accordingly, the foregoing description is by way of example only and is not intended to be limiting. The invention is limited only as defined in the following claims and the equivalents thereto.

What is claimed is:

1. A device for adapting to an impedance of a supply line to optimally supply a load, comprising:

an amplifier having a gain and providing a variable amplitude output signal to the load;

a switched mode voltage regulator providing the amplifier with a substantially constant supply voltage;

a regulation loop to receive a line voltage on the supply line and adjust the gain of the amplifier as a function of the line voltage; and means, coupled to the voltage regulator and the regulation loop, for aligning the supply voltage of the amplifier with the output signal of the amplifier provided to the load.

2. The device of claim 1, wherein the aligning means includes:

comparison means for providing a detection signal which is active when the supply voltage of the amplifier is lower than an adjusted amplitude of the output signal of the amplifier provided to the load; and a low pass filter, coupled to the comparison means and the voltage regulator, for receiving the detection signal and modifying a reference voltage provided to the voltage regulator.

3. The device of claim 2, wherein the the amplifier is coupled to the comparison means and receives from the regulation loop a product of an input signal multiplied by the line voltage, the comparison means being formed by a detector for detecting saturation of the amplifier.

4. The device of claim 4, wherein the amplifier includes an output transistor for supplying the signal to the load based upon the output voltage of the voltage regulator, the saturation detector being designed to detect saturation of the output transistor.

5. The device of claim 2, wherein the voltage regulator receives a low valued reference voltage to which an output voltage of the low-pass filter is added to form the reference voltage provided to the voltage regulator.

6. A device for adapting to an impedance of a supply line to optimally supply a signal to load, the device comprising:

a voltage regulator having an input to receive a line voltage of the supply line and having an output to provide a regulated output voltage;

a signal generator, coupled to the output of the voltage regulator, to generate a first signal, the signal generator having an output to provide the first signal;

a regulation loop, connected to the output of the signal generator and the supply line, to receive the line voltage, modify the first signal based upon the line voltage, and produce a modified first signal; and an alignment circuit, coupled to the output of the voltage regulator, the regulation loop, and the load, to receive the modified first signal and the regulated output voltage, supply the signal to the load, and align the regulated output voltage of the voltage regulator with an amplitude of the signal supplied to the load.

7. The device of claim 6, wherein the voltage regulator is a switched mode voltage regulator, the device further comprising:

a second voltage regulator, coupled between the output of the switched mode voltage regulator and the signal generator, to receive the regulated output voltage of the switched mode voltage regulator and provide a constant voltage to the signal generator that is approximately equal to a lower limit of the regulated output voltage of the switched mode voltage regulator.

8. The device of claim 6, wherein:

the load includes a speaker of a telephone set; and the signal generator includes a processor that generates a variable frequency signal to ring the telephone set.

9. The device of claim 6, wherein the regulation loop modifies the first signal by multiplying the first signal by the line voltage to produce the modified variable frequency signal.

10. The device of claim 6, wherein the regulation loop modifies the first signal by multiplying the first signal by the line voltage and a multiplying coefficient to produce the modified first signal, the multiplying coefficient being selected so that the impedance of the supply line is approximately equal to an impedance of the device when the line voltage is at an equilibrium value.

11. The device of claim 6, wherein the alignment circuit detects a difference between the regulated output voltage and the amplitude of the signal supplied to the load and modifies a reference voltage provided to the voltage regulator to reduce the difference.

12. The device of claim 6, wherein the alignment circuit includes:

a comparison circuit to compare the regulated output voltage of the voltage regulator with the amplitude of the signal supplied to the load and provide a detection signal when the regulated output voltage is lower than the amplitude of the signal supplied to the load; and a low pass filter, coupled to the comparison circuit and the voltage regulator, to receive the detection signal and modify a reference voltage provided to the voltage regulator.

13. The device of claim 12, wherein the alignment circuit further includes an amplifier, coupled to the comparison circuit and the regulation loop, to receive and amplify the modified first signal and supply the signal to the load.

14. The device of claim 13, wherein the comparison circuit includes a saturation detector, coupled to the low pass filter and an output stage of the amplifier, to detect saturation of the output stage and provide the detection signal when the output stage saturates.

15. The device of claim 12, wherein the device further includes an adder, coupled between the low pass filter and the voltage regulator, to add an adjustment voltage produced by the low pass filter to a low value reference voltage to form the reference voltage.

16. The device of claim 15, wherein the alignment circuit further includes an amplifier, coupled to the comparison circuit and the regulation loop, to receive and amplify the modified first signal and supply the signal to the load.

17. The device of claim 16, wherein the comparison circuit includes a saturation detector, coupled to the low pass filter and an output stage of the amplifier, to detect saturation of the output stage and provide the detection signal when the output stage saturates.

18. The device of claim 17, wherein:

the output stage of the amplifier includes first and second transistors having commonly connected collectors that are coupled to the load, an emitter of the first transistor being coupled to the output of the voltage regulator and an emitter of the second transistor being coupled to a reference potential; and the saturation detector includes a third transistor having a collector, an emitter, and a base, the emitter of the third transistor being coupled to the commonly connected collectors, the collector of the third transistor being coupled to the low-pass filter to provide the detection signal, and the base of the third transistor being coupled to a base of the first transistor when the load is coupled to the reference potential and being coupled to a base of the second transistor when the load is coupled to the output of the voltage regulator.

19. The device of claim 16, wherein the regulation loop modifies the first signal by multiplying the first signal by the line voltage and a multiplying coefficient to produce the modified first signal, the multiplying coefficient having a value that is approximately equal to a square root of a product divided by the impedance of the supply line, the product being formed by a resistance of the load multiplied by a global efficiency of the voltage regulator and of the amplifier.

20. The device of claim 19, wherein the value of the multiplying coefficient is further multiplied by a ratio of a peak value of the first signal divided by a mean value of the first signal when the first signal is a variable frequency A.C. signal.

21. A method of adapting an impedance of a circuit that supplies a signal to a load to an impedance of a supply line, the method comprising the steps of:

receiving a line voltage on the supply line;

producing a regulated output voltage based upon the line voltage, the regulated output voltage having an amplitude;

generating a first signal having a variable frequency;

modifying the first signal based upon the line voltage to provide a modified first signal having the variable frequency;

amplifying the modified first signal to supply the signal to the load; and adjusting an amplification of the modified first signal by aligning the amplitude of the regulated output voltage with an amplitude of the signal supplied to the load to change the impedance of the circuit and maximize a power drawn from the supply line and supplied to the load.

22. The method of claim 21, wherein the step of producing the regulated output voltage is based upon the line voltage and a reference voltage; and wherein the step of amplifying the modified first signal includes a step of amplifying the modified first signal based upon the modified first signal and the regulated output voltage.

23. A method of adapting an impedance of a circuit that supplies a signal to a load to an impedance of a supply line, the method comprising the steps of:

receiving a line voltage on the supply line;

producing a regulated output voltage based upon the line voltage and a reference voltage;

generating a first signal;

modifying the first signal based upon the line voltage to provide a modified first signal;

amplifying the modified first signal based upon the modified first signal and the regulated output voltage to supply the signal to the load; and adjusting an amplification of the modified first signal to change the impedance of the circuit and maximize a power drawn from the supply line and supplied to the load, the step of adjusting including steps of aligning the regulated output voltage with an amplitude of the signal supplied to the load;

comparing the regulated output voltage to the amplitude of the signal supplied to the load;

detecting when the regulated output voltage is lower than the amplitude of the signal supplied to the load; and modifying, in response to the step of detecting, the reference voltage to change the impedance of the circuit.

24. The method of claim 23, wherein the step of modifying the reference voltage includes a step of modifying the reference voltage to reduce a difference between the regulated output voltage and the amplitude of the signal supplied to the load.

25. The method of claim 23, wherein the step of detecting when the regulated output voltage is lower than the amplitude of the signal provided to the load includes a step of detecting a saturation of an output stage of an amplifier that amplifies the modified first signal.

26. The method of claim 23, wherein the step of modifying the reference voltage includes a step of increasing, in response to an increase in the line voltage, the reference voltage to increase the regulated output voltage and decrease the impedance of the circuit.

27. The method of claim 23, wherein the step of modifying the reference voltage includes a step of adding an adjustment voltage to a low value reference voltage to produce the reference voltage.

28. The method of claim 27, wherein the step of adjusting further includes a step of filtering, in response to the step of detecting, a detection signal to generate the adjustment voltage.

29. A method of adapting an impedance of a circuit that supplies a signal to a load to an impedance of a supply line, the method comprising the steps of:

receiving a line voltage on the supply line;

producing a regulated output voltage based upon the line voltage and a reference voltage;

generating a first signal;

modifying the first signal based upon the line voltage to provide a modified first signal;

amplifying the modified first signal based upon the modified first signal and the regulated output voltage to supply the signal to the load; and adjusting an amplification of the modified first signal to change the impedance of the circuit and maximize a power drawn from the supply line and supplied to the load;

wherein the step of modifying the first signal includes a step of multiplying the first signal by the line voltage and a multiplication coefficient, the multiplication coefficient being selected so that the impedance of the supply line is approximately equal to an impedance of the circuit when the line voltage is at an equilibrium value.

30. A method of adapting an impedance of a circuit that supplies a signal to a load to an impedance of a supply line, the method comprising the steps of:

receiving a line voltage on the supply line;

generating a first signal;

modifying the first signal based upon the line voltage to provide a modified first signal;

amplifying the modified first signal to supply the signal to the load; and adjusting an amplification of the modified first signal to change the impedance of the circuit and maximize a power drawn from the supply line and supplied to the load;

wherein the step of adjusting includes a step of increasing, in response to an increase in the line voltage, the amplification of the modified first signal to decrease the impedance of the circuit.

31. A circuit that supplies a signal to a load and adapts an impedance of the circuit to an impedance of a supply line, the circuit comprising:

a voltage regulator to receive a line voltage of the supply line and provide a regulated output voltage;

a signal generator, coupled to the voltage regulator, to provide a first signal;

a regulation loop, coupled to the signal generator, to modify the first signal based upon the line voltage and produce a modified first signal;

an amplifier, coupled to the voltage regulator, the regulation loop, and the load, to amplify the modified first signal and supply the signal to the load; and adjustment means, coupled to the voltage regulator and the amplifier, for adjusting an amplification of the modified first signal to change the impedance of the circuit and maximize a power drawn from the supply line and supplied to the load.

32. The circuit of claim 31, wherein the voltage regulator is a switched mode voltage regulator, the circuit further comprising:

a second voltage regulator, coupled between the switched mode voltage regulator and the signal generator, to receive the regulated output voltage of the switched mode voltage regulator and provide a constant voltage to the signal generator that is approximately equal to a lower limit of the output voltage of the switched mode voltage regulator.

33. The circuit of claim 31, wherein the regulation loop modifies the first signal by multiplying the first signal by the line voltage and a multiplying coefficient to produce the modified first signal, the multiplying coefficient being selected so that the impedance of the supply line is approximately equal to an impedance of the circuit when the line voltage is at an equilibrium value.

34. The circuit of claim 31, wherein the regulation loop modifies the first signal by multiplying the first signal by the line voltage and a multiplying coefficient to produce the modified first signal, the multiplying coefficient having a value that is approximately equal to a square root of a product divided by the impedance of the supply line, the product being formed by a resistance of the load multiplied by a global efficiency of the voltage regulator and of the amplifier.

35. The circuit of claim 34, wherein the value of the multiplying coefficient is further multiplied by a ratio of a peak value of the first signal divided by a mean value of the first signal when the first signal is a variable frequency A.C. signal.

36. The circuit of claim 31, wherein the adjustment means includes alignment means, coupled to the amplifier and the voltage regulator, for aligning the regulated output voltage with an amplitude of the signal supplied to the load.

37. The circuit of claim 36, wherein the alignment means detects a difference between the regulated output voltage and the amplitude of the signal supplied to the load and modifies a reference voltage provided to the voltage regulator to reduce the difference.

38. The circuit of claim 36, wherein the alignment means includes:

a comparison circuit to compare the regulated output voltage with the amplitude of the signal supplied to the load and provide a detection signal when the regulated output voltage is lower than the amplitude of the signal supplied to the load; and a low pass filter, coupled to the comparison circuit and the voltage regulator, to receive the detection signal and modify a reference voltage provided to the voltage regulator.

39. The circuit of claim 38, wherein the alignment means further includes an adder, coupled between the low pass filter and the voltage regulator, to add an adjustment voltage produced by the low pass filter to a low value reference voltage to form the reference voltage.

40. The circuit of claim 38, wherein the comparison circuit includes a saturation detector, coupled to the low pass filter and an output stage of the amplifier, to detect saturation of the output stage and provide the detection signal when the output stage saturates.

41. The circuit of claim 40, wherein:

the output stage of the amplifier includes first and second transistors having commonly connected collectors that are coupled to the load, an emitter of the first transistor being coupled to the regulated output voltage of the voltage regulator and an emitter of the second transistor being coupled to a reference potential; and the saturation detector includes a third transistor having a collector, an emitter, and a base, the emitter of the third transistor being coupled to the commonly connected collectors, the collector of the third transistor being coupled to the low-pass filter to provide the detection signal, and the base of the third transistor being coupled to a base of the first transistor when the load is coupled to the reference potential and being coupled to a base of the second transistor when the load is coupled to the regulated output voltage of the voltage regulator.

42. A device for adapting to an impedance of a supply line to optimally supply a load, comprising:

a switched mode voltage regulator from which is drawn a signal provided to the load;

a regulation loop to receive a line voltage on the supply line and adjust an amplitude of the signal provided to the load as a function of the line voltage; and means, coupled to the voltage regulator and the regulation loop, for aligning an output voltage of the voltage regulator with the amplitude of the signal provided to the load, wherein the aligning means includes comparison means for providing a detection signal which is active when the output voltage of the voltage regulator is lower than an adjusted amplitude of the signal to be provided to the load, a low pass filter, coupled to the comparison means and the voltage regulator, for receiving the detection signal and modifying a reference voltage of the voltage regulator, and an amplifier, coupled to the comparison means, for supplying the signal to the load and receiving from the regulation loop a product of an input signal multiplied by the line voltage, the comparison means being formed by a detector for detecting saturation of the amplifier.

43. The device of claim 42, wherein the amplifier includes an output transistor for supplying the signal to the load from the output voltage of the voltage regulator, the saturation detector being designed to detect saturation of the output transistor.

* * * * *